(12) United States Patent
Lin et al.

(10) Patent No.: US 8,405,436 B2
(45) Date of Patent: Mar. 26, 2013

(54) MULTI-PHASE CLOCK GENERATOR

(75) Inventors: Chan-Fei Lin, Tainan (TW); Shih-Chun Lin, Tainan (TW)

(73) Assignee: Himax Technologies Limited, Tainan (TW)

( * ) Notice: Subject to any disclaimer, the term of this patent is extended or adjusted under 35 U.S.C. 154(b) by 93 days.

(21) Appl. No.: 13/186,076

(22) Filed: Jul. 19, 2011

(65) Prior Publication Data

US 2013/0022162 A1 Jan. 24, 2013

(51) Int. Cl.
*H03L 7/06* (2006.01)

(52) U.S. Cl. ......... 327/158; 327/156; 327/298; 327/299

(58) Field of Classification Search .......... 327/155–159, 327/161, 291, 295–299
See application file for complete search history.

(56) References Cited

U.S. PATENT DOCUMENTS

| 6,650,160 | B2 * | 11/2003 | Tanahashi | 327/277 |
| 7,126,407 | B2 * | 10/2006 | Furtner | 327/298 |
| 7,254,201 | B2 * | 8/2007 | Kim | 375/354 |
| 7,795,937 | B2 * | 9/2010 | Smith et al. | 327/158 |

* cited by examiner

*Primary Examiner* — An Luu
(74) *Attorney, Agent, or Firm* — J.C. Patents

(57) ABSTRACT

A multi-phase clock generator including a first delay locked loop, a reference signal generator and a second delay locked loop is provided. The first delay locked loop generates $2^N$ phase clock signals according to an input clock signal, so as to equally divide a clock period of the input clock signal into $2^N$ predetermined phases, where N is a positive integer. The reference signal generator selects two phase clock signals according to a digital signal, and adjusts an output ratio of the two phase clock signals in $2^M$ clock periods to serve as a reference clock signal. The second delay locked loop delays a first phase clock signal according to a phase difference between the reference clock signal and an output clock signal. In this way, each predetermined phase is further equally divided into $2^M$ sub-phases, so that the multi-phase clock generator has $2^{(N+M)}$ phase selections.

9 Claims, 4 Drawing Sheets

MULTI-PHASE CLOCK GENERATOR

BACKGROUND

1. Field of the Invention

The invention relates to a multi-phase clock generator. Particularly, the invention relates to a multi-phase clock generator inbuilt with two delay locked loops.

2. Description of Related Art

Generally, in an integrated circuit (IC), each clock period is equally divided into a plurality of phases, so that a digital circuit can select one of the phases to perform data sampling. In order to achieve the above function, the IC is generally configured with a multi-phase clock generator.

FIG. 1 is a block diagram of a conventional multi-phase clock generator. As shown in FIG. 1, the conventional multi-phase clock generator 100 generates an output clock signal clk12 with 256 phase selections according to a digital signal S1 with 8 bits. A delay locked loop 110 simultaneously generates 256 phase clock signals P0-P255 according to an input clock signal clk11. Moreover, a phase selector 120 selects and outputs one of the phase clock signals P0-P255 to serve as the output clock signal clk12 according to the digital signal S1. In other words, the multi-phase clock generator 100 is formed by the single delay locked loop 110 and the single phase selector 120. The delay locked loop 110 has to simultaneously generate 256 phase clock signals to make the multi-phase clock generator 100 achieve the 256 phase selections.

However, under the conventional structure, the delay locked loop 110 has to connect 256 delay devices in series for generating the 256 phase clock signals. Therefore, when a number of the divided phases is large, a layout area and power consumption of the conventional multi-phase clock generator 100 are relatively great and the maximum operating frequency of the whole circuit is even limited. Moreover, when the number of the divided phases is excessive, numbers of input buffers and multiplexers built in the phase selector 120 are also increased, which may further increase the layout area and the power consumption of the conventional multi-phase clock generator 100.

SUMMARY OF THE INVENTION

The invention is directed to a multi-phase clock generator inbuilt with two delay locked loops, by which layout area and power consumption of the multi-phase clock generator are reduced.

The invention provides a multi-phase clock generator including a first delay locked loop, a reference signal generator and a second delay locked loop. The first delay locked loop generates $2^N$ phase clock signals according to an input clock signal, where N is a positive integer. The reference signal generator selects an $i^{th}$ and an $(i+1)^{th}$ phase clock signals from the $2^N$ phase clock signals according to a digital signal, and during $2^M$ clock periods of the input clock signal, the reference signal generator selects and outputs one of the $i^{th}$ and the $(i+1)^{th}$ phase clock signals to serve as a reference clock signal according to the digital signal within each of the clock periods, where i and M are integer, $0 \leq i \leq (2^N-1)$ and $M>0$. The second delay locked loop delays a first phase clock signal generated by the first delay locked loop according to a phase difference between the reference clock signal and an output clock signal, and outputs the output clock signal.

In an embodiment of the invention, a resolution of the digital signal is (N+M) bits. Moreover, the reference signal generator selects the $i^{th}$ and the $(i+1)^{th}$ phase clock signals from the $2^N$ phase clock signals according to a $(N+M)^{th}$ bit to a $(M+1)^{th}$ bit of the digital signal, and then the reference signal generator selects and outputs one of the $i^{th}$ and the $(i+1)^{th}$ phase clock signals according to a $M^{th}$ bit to a first bit of the digital signal within each of the clock periods.

In an embodiment of the invention, the reference signal generator uses a delta-sigma modulation method to control a ratio of the $i^{th}$ and the $(i+1)^{th}$ phase clock signals serving as the reference clock signals during the $2^M$ clock periods.

In an embodiment of the invention, the reference signal generator includes a first multiplexer, a second multiplexer, a delta-sigma modulator and a third multiplexer. The first multiplexer receives the $2^N$ phase clock signals, and outputs the $i^{th}$ phase clock signal according to the $(N+M)^{th}$ bit to the $(M+1)^{th}$ bit of the digital signal. The second multiplexer receives the $2^N$ phase clock signals, and outputs the $(i+1)^{th}$ phase clock signal according to the $(N+M)^{th}$ bit to the $(M+1)^{th}$ bit of the digital signal. The delta-sigma modulator receives the $M^{th}$ bit to the first bit of the digital signal and an integration clock signal, and updates a modulation signal within each of the clock periods. The third multiplexer selects and outputs one of the $i^{th}$ and the $(i+1)^{th}$ phase clock signals to serve as the reference clock signal according to the modulation signal.

In an embodiment of the invention, the second delay locked loop includes a phase detector, a charge pump, a low pass filter and a voltage-controlled delay line. The phase detector detects a phase difference between the reference clock signal and the output clock signal to generate a plurality of switching signals. The charge pump generates a control current according to the switching signals. The low pass filter receives the control current and generates a control voltage. The voltage-controlled delay line delays the first phase clock signal generated by the first delay locked loop according to the control voltage to generate the output clock signal.

According to the above descriptions, in the invention, the first delay locked loop is used to generate the $2^N$ phase clock signals, so as to equally divide the cycle of the input clock signal into $2^N$ predetermined phases. Moreover, the reference signal generator and the second delay locked loop are used to further divide each predetermined phase into $2^M$ sub-phases. In this way, the output clock signal generated by the multi-phase clock generator has $2^{(N+M)}$ phase selections, so that the layout area and the power consumption of the multi-phase clock generator are reduced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
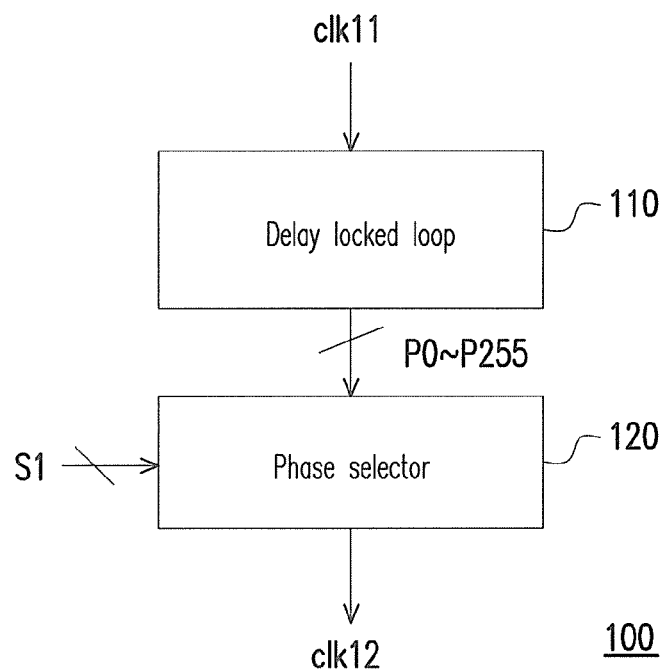
FIG. 1 is a block diagram of a conventional multi-phase clock generator.
Figure 2:
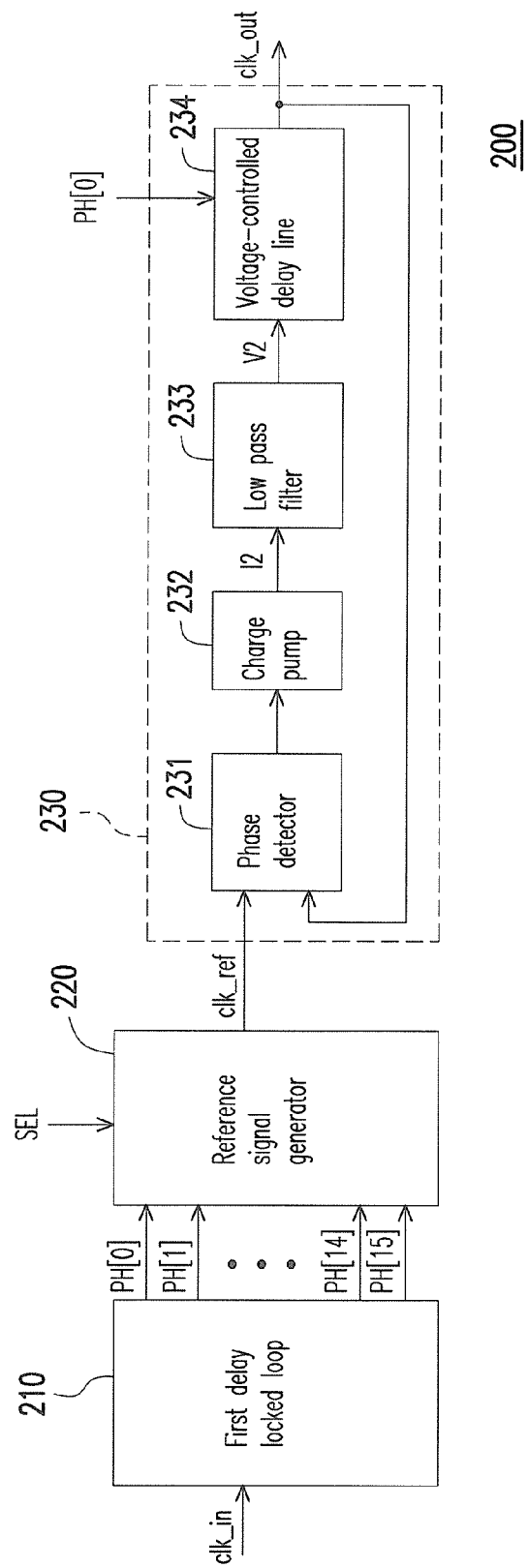
FIG. 2 is a block diagram of a multi-phase clock generator according to an embodiment of the invention.

FIG. 2 is a block diagram of a multi-phase clock generator according to an embodiment of the invention. Referring to FIG. 2, the multi-phase clock generator 200 includes a first delay locked loop 210, a reference signal generator 220 and a second delay locked loop 230. The first delay locked loop 210 generates $2^N$ phase clock signals according to an input clock signal clk_in, where N is a positive integer. For example, in the present embodiment, N=4 is taken as an example, and the first delay locked loop 210 generates 16 phase clock signals PH[0]-PH[15].

Figure 3:
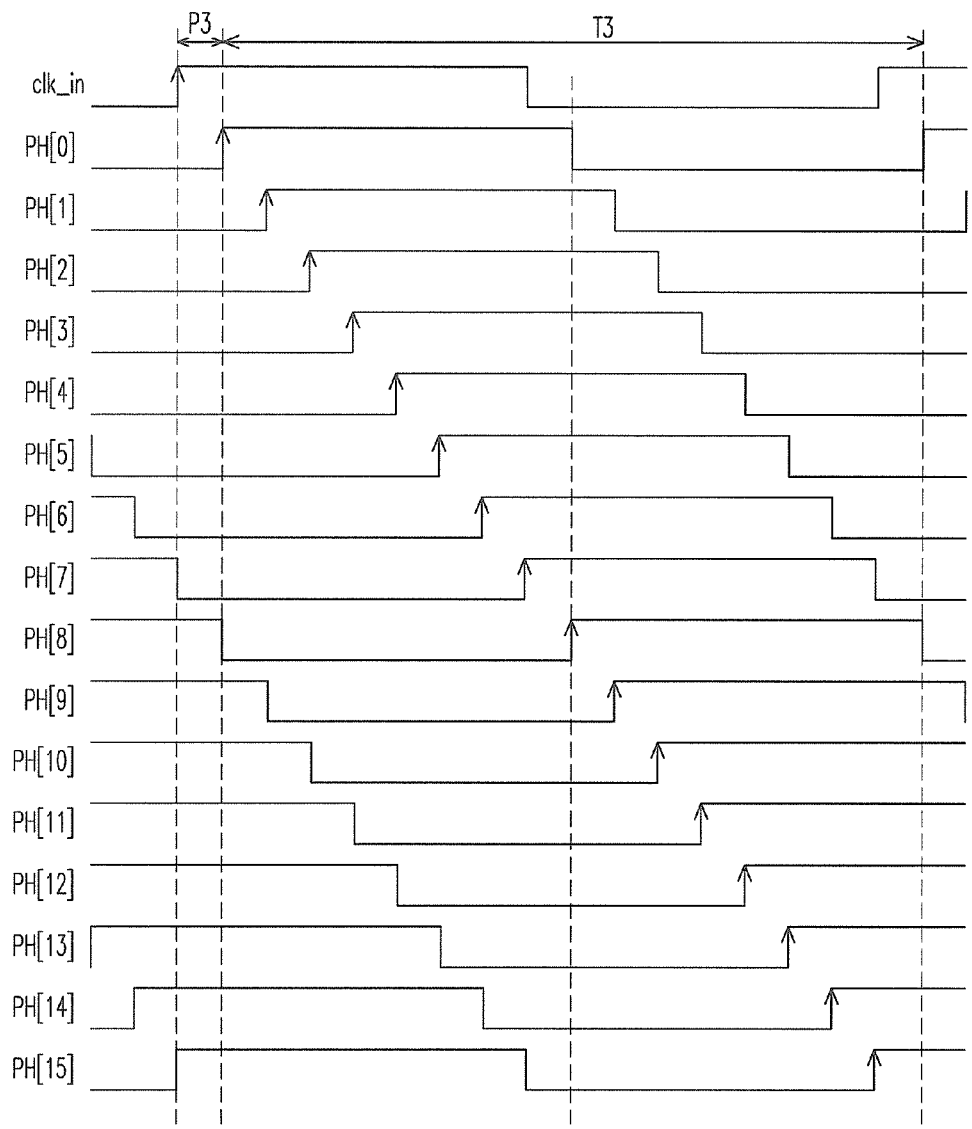
FIG. 3 is a signal timing diagram according to an embodiment of the invention.

Moreover, the first delay locked loop 210 outputs the phase clock signals PH[0]-PH[15] in a parallel manner, so that the reference signal generator 220 can simultaneously receive the phase clock signals PH[0]-PH[15] from the first delay locked loop 210. Moreover, FIG. 3 is a signal timing diagram according to an embodiment of the invention. As shown in FIG. 3, periods of the input clock signal clk_in and the phase clock signals PH[0]-PH[15] are equal to T3, which is defined as a clock period T3. In addition, two adjacent phase clock signals in the phase clock signals PH[0]-PH[15] have a phase difference of a predetermined phase P3. For example, a phase difference between the two adjacent phase clock signals PH[1] and PH[2] is the predetermined phase P3.

On the other hand, the reference signal generator 220 receives a digital signal SEL with (N+M) bits, wherein N and M are positive integer. Moreover, the reference signal generator 220 selects an $i^{th}$ and an $(i+1)^{th}$ phase clock signals from the $2^N$ phase clock signals according to a $(N+M)^{th}$ bit to a $(M+1)^{th}$ bit of the digital signal SEL, wherein i is an integer and $0 \leq i \leq 2^N - 1$. Moreover, during $2^M$ clock periods, the reference signal generator 220 selects and outputs one of the $i^{th}$ and the $(i+1)^{th}$ phase clock signals to serve as a reference clock signal clk_ref according to a $M^{th}$ bit to a first bit of the digital signal SEL within each clock period. Moreover, the reference signal generator 220 uses a delta-sigma modulation method to control a ratio of the $i^{th}$ and the $(i+1)^{th}$ phase clock signals serving as the reference clock signals during the $2^M$ clock periods.

For example, N=M=4 is taken as an example, a resolution of the digital signal SEL is 8 bits. Moreover, the reference signal generator 220 selects two adjacent phase clock signals, for example, the phase clock signals PH[1] and PH[2] from the phase clock signals PH[0]-PH[15] according to front four bits SEL[8:5] of the digital signal SEL. Moreover, when the reference clock signal clk_ref is formed by one of the phase clock signals PH[1] and PH[2], during 16 clock periods, the reference signal generator 220 selects one of the phase clock signals PH[1] and PH[2] to serve as the reference clock signal clk_ref according to rear four bits SEL[4:1] of the digital signal SEL within each clock period.

It should be noticed that the reference signal generator 220 uses the delta-sigma modulation method to control a ratio of the phase clock signals PH[1] and PH[2] output to serve as the reference clock signal clk_ref during the 16 clock periods. Namely, the reference signal generator 220 selectively outputs the phase clock signal PH[1] or the phase clock signal PH[2] according to the delta-sigma modulation method. Therefore, the higher the bit value of the rear four bits SEL[4:1] is, the more times the phase clock signal PH[2] appears during the 16 clock periods. Comparatively, the lower the bit value of the rear four bits SEL[4:1] is, the more times the phase clock signal PH[1] appears during the 16 clock periods. For example, when the bit value of the rear four bits SEL[4:1] is 0, during the 16 clock periods, the reference clock signals clk_ref output by the reference signal generator 220 are all formed by the phase clock signal PH[1].

On the other hand, during the $2^M$ clock periods, the second delay locked loop 230 sequentially receives the reference clock signals clk_ref formed by the $i^{th}$ phase clock signal or the $(i+1)^{th}$ phase clock signal. Moreover, the second delay locked loop 230 delays the first phase clock signal PH[0] according to a phase difference between the reference clock signal clk_ref and an output clock signal clk_out, and locks to adjust the output clock signal clk_out.

N=M=4 is taken as an example to further describe operations of the reference signal generator 220 and the second delay locked loop 230. Here, when a bit value of the front four bits SEL[8:5] of the digital signal SEL is 0, the reference clock signal clk_ref is formed by the phase clock signal PH[0] or the phase clock signal PH[1]. Moreover, during the 16 clock periods, the reference clock signal clk_ref transmitted to the second delay locked loop 230 may have 16 different combinations. Moreover, the 16 different combinations can be controlled through the rear four bits SEL[4:1] of the digital signal SEL, so that the second delay locked loop 230 can further divide 16 sub-phases between the phase clock signals PH[0] and PH[1].

For example, when the bit value of the rear four bits SEL[4:1] is 0, during the 16 clock periods, the reference clock signals clk_ref sequentially transmitted to the second delay locked loop 230 are all formed by the phase clock signal PH[0]. Therefore, after the 16 clock periods, the output clock signal clk_out locked by the second delay locked loop 230 is synchronized to the phase clock signal PH[0]. Moreover, when the bit value of the rear four bits SEL[4:1] is 1, the reference signal generator 220 transmits the reference clock signal clk_ref formed by the phase clock signal PH[0] through one clock period T3, and transmits the reference clock signals clk_ref formed by the phase clock signal PH[1] through 15 clock periods. In this way, after the 16 clock periods, a rising edge of the output clock signal clk_out locked by the second delay locked loop 230 is between rising edges of the phase clock signals PH[0] and PH[1].

Moreover, as the bit value of the rear four bits SEL[4:1] increases, the rising edge of the output clock signal clk_out gradually departs from the rising edge of the phase clock signal PH[0], though it is still between the rising edge of the phase clock signal PH[0] and the rising edge of the phase clock signal pH[1]. In other words, when the bit value of the front four bits SEL[8:5] of the digital signal SEL is 0, as the bit value of the rear four bits SEL[4:1] of the digital signal SEL is varied, the second delay locked loop 230 can further divide 16 sub-phases between the phase clock signals PH[0] and PH[1]. Namely, the predetermined phase P3 between the phase clock signals PH[0] and PH[1] can be equally divided into 16 sub-phases.

Similarly, when the bit value of the front four bits SEL[8:5] of the digital signal SEL is 1, the reference clock signal clk_ref is formed by the phase clock signal PH[1] or the phase clock signal PH[2]. Moreover, as the bit value of the rear four bits SEL[4:1] of the digital signal SEL varies, the second delay locked loop 230 can further divide 16 sub-phases between the phase clock signals PH[1] and PH[2]. Namely, the predetermined phase P3 between the phase clock signals PH[1] and PH[2] can be equally divided into the 16 sub-phases. Deduced by analogy, the predetermined phase P3 between the phase clock signals PH[2] and PH[3] can be equally divided into 16 sub-phases, and the predetermined phase P3 between the phase clock signals PH[3] and PH[4] can be equally divided into 16 sub-phases, etc.

In other words, the multi-phase clock generator 200 first generates the 16 phase clock signals PH[0]-PH[15] through the first delay locked loop 210, so as to equally divide the cycle of the input clock signal clk_in into 16 predetermined phases P3. Then, the multi-phase clock generator 200 further equally divides each predetermined phase P3 into 16 sub-phases through the reference signal generator 220 and the second delay locked loop 230. In this way, the output clock signal clk_out generated by the multi-phase clock generator 200 has 256 phase selections.

It should be noticed that since the multi-phase clock generator 200 can generate the output clock signal clk_out having 256 phase selections without simultaneously generating 256 phase clock signals, a layout area and power consumption of the multi-phase clock generator 200 can be reduced, which avails reducing the production cost of the multi-phase clock generator 200.

Further, the second delay locked loop 230 includes a phase detector (PD) 231, a charge pump (CP) 232, a low pass filter (LPF) 233 and a voltage-controlled delay line (VCDL) 234. The PD 231 is electrically connected to the reference signal generator 220 and the VCDL 234. The CP 232 is electrically connected to the PD 231. Moreover, the LPF 233 is electrically connected between the CP 232 and the VCDL 234.

In operation, the PD 231 detects a phase difference between the reference clock signal clk_ref and the output clock signal clk_out to generate a plurality of switching signals. Moreover, the CP 232 generates a control current I2 according to the switching signals, and the LPF 233 receives the control current I2 to generate a control voltage V2. In addition, the VCDL 234 delays the phase clock signal PH[0] according to the control voltage V2. In this way, as the reference clock signal clk_ref lags the output clock signal clk_out, the CP 232 decreases the control current I2 according to the switching signals. Now, the control voltage V2 generated by the LPF 233 is also decreased as the control current I2 is decreased.

Moreover, the smaller the control voltage V2 is, the greater a delay amount provided by the VCDL 234 is. Therefore, as the control voltage V2 decreases, the VCDL 234 increases the delay amount of the phase clock signal PH[0], so that the output clock signal clk_out is moved forward along a time axis. Comparatively, when the reference clock signal clk_ref leads the output clock signal clk_out, the control current I2 generated by the CP 232 is increased, so that a level of the control voltage V2 is increased. Therefore, as the control voltage V2 increases, the VCDL 234 decreases the delay amount of the phase clock signal PH[0], so that the output clock signal clk_out is moved backward along the time axis.

Figure 4:
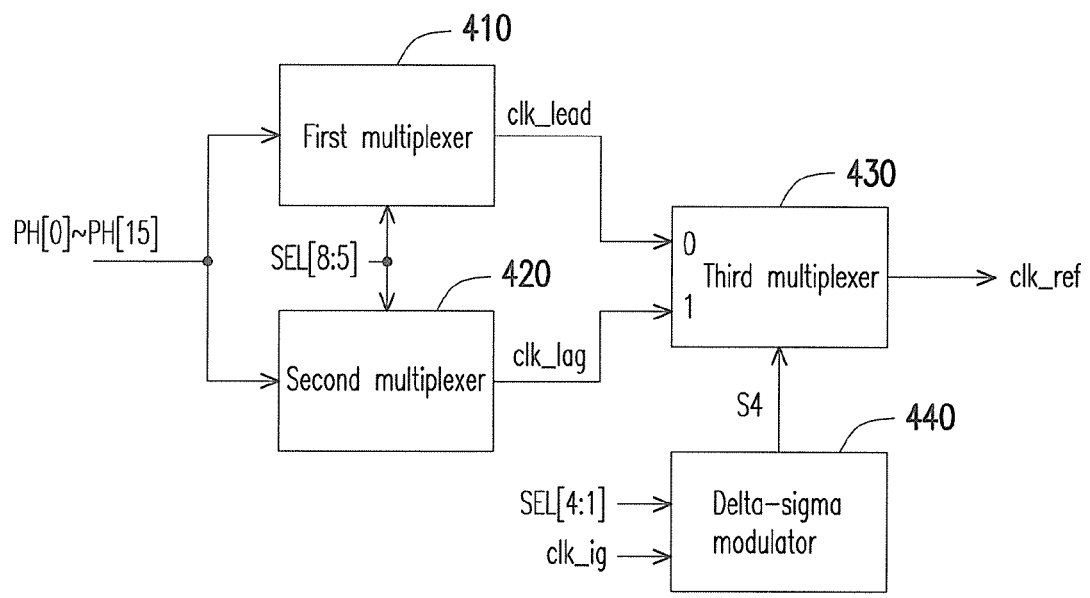
FIG. 4 is a block schematic diagram of a reference signal generator according to an embodiment of the invention.

FIG. 4 is a block schematic diagram of a reference signal generator according to an embodiment of the invention. Referring to FIG. 4, the reference signal generator 220 includes a first multiplexer 410, a second multiplexer 420, a third multiplexer 430 and a delta-sigma modulator 440. The third multiplexer 430 is electrically connected to the first multiplexer 410 and the second multiplexer 420. Moreover, the delta-sigma modulator 440 is electrically connected to the third multiplexer 430.

In view of a whole operation, the first multiplexer 410 receives the $2^N$ phase clock signals from the first delay locked loop 210, for example, taking N=M=4 as an example, the first multiplexer 410 receives 16 phase clock signals PH[0]-PH[15]. Moreover, the first multiplexer 410 outputs the $i^{th}$ phase clock signal according to the $(N+M)^{th}$ bit to the $(M+1)^{th}$ bit, for example, the front four bits SEL[8:5] of the digital signal SEL. In FIG. 4, clk_lead is used to represent the $i^{th}$ phase clock signal. Moreover, the second multiplexer 420 also receives the $2^N$ phase clock signals from the first delay locked loop 210, for example, the phase clock signals PH[0]-PH[15]. Moreover, the second multiplexer 420 outputs the $(i+1)^{th}$ phase clock signal according to the $(N+M)^{th}$ bit to the $(M+1)^{th}$ bit, for example, the front four bits SEL[8:5] of the digital signal SEL. In FIG. 4, clk_lag is used to represent the $(i+1)^{th}$ phase clock signal.

The delta-sigma modulator 440 receives the $M^{th}$ bit to the first bit (for example, SEL[4:1]) of the digital signal SEL and an integration clock signal clk_ig, wherein a frequency of the integration clock signal clk_ig is equal to a frequency of the input clock signal clk_in. Moreover, the delta-sigma modulator 440 updates a modulation signal S4 within each clock period T3, and outputs the modulation signal S4 to the third multiplexer 430. The third multiplexer 430 selects and outputs one of the $i^{th}$ phase clock signal clk_lead and the $(i+1)^{th}$ phase clock signal clk_lag to serve as the reference clock signal clk_ref according to the modulation signal S4.

For example, when the bit value of the front four bits SEL[8:5] of the digital signal SEL is 0, the first multiplexer 410 selects and outputs the phase clock signal PH[0] to serve as the phase clock signal clk_lead, and the second multiplexer 420 selects and outputs the phase clock signal PH[1] to serve as the $(i+1)^{th}$ phase clock signal clk_lag. Similarly, when the bit value of the front four bits SEL[8:5] of the digital signal SEL is 1, the first multiplexer 410 selects and outputs the phase clock signal PH[1] to serve as the $i^{th}$ phase clock signal clk_lead, and the second multiplexer 420 selects and outputs the phase clock signal PH[2] to serve as the $(i+1)^{th}$ phase clock signal clk_lag. In other words, the two phase clock signals used to form the reference clock signal clk_ref can be set through the front four bits SEL[8:5] of the digital signal SEL.

Moreover, the delta-sigma modulator 440 determines times for setting the modulation signal S4 to logic 1/0 during the 16 clock periods according to the rear four bits SEL[4:1] of the digital signal SEL, and updates the modulation signal S4 within each clock period T3 according to a setting result. For example, when the bit value of the rear four bits SEL[4:1] is 0, the times for setting the modulation signal S4 to logic 0 is 16, and the times for setting the modulation signal S4 to logic 1 is 0.

Therefore, the delta-sigma modulator 440 updates the modulation signal S4 to logic 0 within each clock period T3. As a result, during the 16 clock periods, the third multiplexer 430 outputs the $i^{th}$ phase clock signal clk_lead to serve as the reference clock signal clk_ref. Moreover, as the bit value of the rear four bits SEL[4:1] increases, the times for setting the modulation signal S4 to the logic 1 is gradually increased. In this way, during the 16 clock periods, the times that the reference clock signal clk_ref is formed by the $(i+1)^{th}$ phase clock signal clk_lag is also increased.

In summary, in the invention, the first delay locked loop is used to generate the $2^N$ phase clock signals, so as to equally divide the period of the input clock signal into $2^N$ predetermined phases. Moreover, the reference signal generator and the second delay locked loop are used to further equally divide each predetermined phase into $2^M$ sub-phases. In this way, the output clock signal generated by the multi-phase clock generator has $2^{(N+M)}$ phase selections. Moreover, since the multi-phase clock generator of the invention is only required to simultaneously generate $2^N$ phase clock signals to achieve the $2^{(N+M)}$ phase selections, the layout area and the power consumption of the multi-phase clock generator are reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A multi-phase clock generator, comprising:
a first delay locked loop, for generating $2^N$ phase clock signals according to an input clock signal, wherein N is a positive integer;
a reference signal generator, for selecting an $i^{th}$ and an $(i+1)^{th}$ phase clock signals from the phase clock signals according to a digital signal, and during $2^M$ clock periods of the input clock signal, selecting and outputting one of the $i^{th}$ and the $(i+1)^{th}$ phase clock signals to serve as a reference clock signal according to the digital signal within each of the clock periods, wherein i and M are integer, $0 \leq i \leq (2^N-1)$ and M>0; and
a second delay locked loop, for delaying a first phase clock signal according to a phase difference between the reference clock signal and an output clock signal, and outputting the output clock signal.

2. The multi-phase clock generator as claimed in claim 1, wherein a resolution of the digital signal is (N+M) bits, the reference signal generator selects the $i^{th}$ and the $(i+1)^{th}$ phase clock signals from the phase clock signals according to a $(N+M)^{th}$ bit to a $(M+1)^{th}$ bit of the digital signal, and the reference signal generator selects and outputs one of the $i^{th}$ and the $(i+1)^{th}$ phase clock signals according to a $M^{th}$ bit to a first bit of the digital signal within each of the clock periods.

3. The multi-phase clock generator as claimed in claim 2, wherein the first bit of the digital signal is a least significant bit, and the $(N+M)^{th}$ bit of the digital signal is a most significant bit.

4. The multi-phase clock generator as claimed in claim 2, wherein the reference signal generator comprises:
a first multiplexer, for receiving the phase clock signals, and outputting the $i^{th}$ phase clock signal according to the $(N+M)^{th}$ bit to the $(M+1)^{th}$ bit of the digital signal;
a second multiplexer, for receiving the phase clock signals, and outputting the $(i+1)^{th}$ phase clock signal according to the $(N+M)^{th}$ bit to the $(M+1)^{th}$ bit of the digital signal;
a delta-sigma modulator, for receiving the $M^{th}$ bit to the first bit of the digital signal and an integration clock signal, and updating a modulation signal within each of the clock periods; and
a third multiplexer, for selecting and outputting one of the $i^{th}$ and the $(i+1)^{th}$ phase clock signals to serve as the reference clock signal according to the modulation signal.

5. The multi-phase clock generator as claimed in claim 4, wherein a frequency of the integration clock signal is equal to a frequency of the input clock signal.

6. The multi-phase clock generator as claimed in claim 1, wherein the second delay locked loop comprises:
a phase detector, for detecting a phase difference between the reference clock signal and the output clock signal to generate a plurality of switching signals;
a charge pump, for generating a control current according to the switching signals;
a low pass filter, for receiving the control current to generate a control voltage; and
a voltage-controlled delay line, for delaying the first phase clock signal according to the control voltage to generate the output clock signal.

7. The multi-phase clock generator as claimed in claim 1, wherein the first delay locked loop outputs the phase clock signals in a parallel manner.

8. The multi-phase clock generator as claimed in claim 1, wherein two adjacent phase clock signals in the phase clock signals have a phase difference of a predetermined phase.

9. The multi-phase clock generator as claimed in claim 1, wherein the reference signal generator uses a delta-sigma modulation method to control a ratio of the $i^{th}$ and the $(i+1)^{th}$ phase clock signals serving as the reference clock signals during the $2^M$ clock periods.

* * * * *